(12) United States Patent
Asami

(10) Patent No.: US 6,407,869 B1
(45) Date of Patent: Jun. 18, 2002

(54) EXTERNAL CAVITY TYPE LIGHT SOURCE

(75) Inventor: Keisuke Asami, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/447,559

(22) Filed: Nov. 23, 1999

(30) Foreign Application Priority Data

Nov. 25, 1998 (JP) .......................................... 10-334420

(51) Int. Cl.$^7$ ......................... G02B 27/30; G02B 5/18; H01S 3/10
(52) U.S. Cl. ...................... 359/641; 359/558; 359/566; 359/569; 372/20
(58) Field of Search .............................. 359/641, 558, 359/566, 569, 247, 248; 372/20, 92, 96

(56) References Cited

U.S. PATENT DOCUMENTS

| | | | |
|---|---|---|---|
| 5,491,714 A | 2/1996 | Kitamura | 372/92 |
| 5,559,816 A | 9/1996 | Basting et al. | 372/27 |
| 5,684,611 A | 11/1997 | Rakuljic et al. | 359/7 |
| 5,751,758 A | * 5/1998 | Kuwatsuka | 372/96 |
| 6,081,539 A | * 6/2000 | Mattori et al. | 372/20 |

FOREIGN PATENT DOCUMENTS

| | | |
|---|---|---|
| DE | 19544897 | 5/1997 |
| EP | 0335691 | 4/1989 |
| EP | 0921 614 | 6/1999 |
| JP | 06140717 A | 5/1994 |

OTHER PUBLICATIONS

U.S. application No. 09/176,301, Asami, filed Oct. 22, 1998.
Lewis, "Low Noise Laser for Optically Pumped Cesium Standards", Proceedings of the Annual Frequency Control Symposium, IEEE, vol. Symp. 43, 1989, pp. 151–157.
Bouchoule et al., "Highly Attenuating External Cavity For Picosecond–Tunable Pulse Generation From Gain/Q–Switched Laer Diodes," *IEEE Journal of Quantum Electronics*, vol. 29, No. 6, Jun. 29, 1993, pp. 1693–1700.

* cited by examiner

*Primary Examiner*—Georgia Epps
*Assistant Examiner*—Tim Thompson
(74) *Attorney, Agent, or Firm*—Finnegan, Henderson, Farabow, Garrett & Dunner LLP

(57) ABSTRACT

An external cavity type light source which has a semiconductor laser (1) coated on one end (1a) with a reflection prevention film (1A), wherein emitted light from the end face of the semiconductor laser 1 on the reflection prevention film side is converted into collimated light and the collimated light having a wavelength selected through a diffraction grating (2) is fed back into the semiconductor laser (1), and wherein emitted light from an opposite end (1b) of the semiconductor laser (1) is converted into collimated light and the collimated light is gathered and output to an optical fiber (10). An unpolarized light splitter (light branch element) (4) is placed between the diffraction grating (2) and the semiconductor laser (1), and the diffracted light fed back into the semiconductor laser from the diffraction grating is made to branch through the unpolarized light splitter (4) and one branch light is taken out as output light through an optical fiber (15).

5 Claims, 3 Drawing Sheets

EXTERNAL CAVITY TYPE LIGHT SOURCE

BACKGROUND OF THE INVENTION

1. Field of the Invention

This invention relates to an external cavity type light source used in coherent light communication and measurement technology fields.

2. Description of the Related Art

An external cavity type light source in a related art will be discussed with reference to FIGS. 4 and 5.

FIG. 4 is a block diagram to show an example of an external cavity type light source in a related art (Littrow optical system) and FIG. 5 is a graph to show the spectrum of output light of the external cavity type light source in FIG. 4.

In FIG. 4, numeral 1 denotes. a semiconductor laser, which will be hereinafter abbreviated to LD, numeral 2 denotes a diffraction grating, numerals 5, 6, and 7 denote lenses, numeral 8 denotes a light isolator, and numeral 10 denotes an optical fiber.

The LD 1 is coated on one end face 1a (end face on the diffraction rating 2 side) with a reflection prevention film 1A to prevent Fabry-Perot resonation on both end faces of the LD.

Emitted light from the end face 1a coated with the reflection prevention film 1A is converted into collimated light through the lens 6 and is incident on the diffraction grating 2. Of the light incident on the diffraction grating 2, only the light whose wavelength is selected through the diffraction grating 2 is diverted 180 degrees and advances, then is gathered through the lens 6 and is fed back into the LD 1. That is, an end face 1b of the LD 1 and the diffraction grating 2 make up an external resonator for lasing.

On the other hand, emitted light from the end face 1b of the LD 1 is converted into collimated light through the lens 5, passes through the light isolator 8, and is gathered through the lens 7, then is taken out as output light through the optical fiber 10.

However, in the external cavity type light source in the related art, as shown in FIG. 5, the output light contains naturally emitted light of a wide wavelength band emitted to the lens 5 directly from the LD 1 in addition to the laser light of a single wavelength selected through the diffraction grating 2, and light of a pure wavelength cannot be taken out as output light.

Specifically, in the example of the light source in the related art, the side mode suppression ratio (power ratio between the laser light of a single wavelength and the naturally emitted light of a wide wavelength band) is about 40 to 50 dB.

The external cavity type light source based on a general Littrow optical system as described above involves the following problem: In wavelength sweeping, mode hop occurs and light output varies.

SUMMARY OF THE INVENTION

It is therefore an object of the invention to provide an external cavity type light source which enables light of a pure wavelength with extremely less naturally emitted light to be taken out as output light and can prevent mode hop from occurring for enabling continuous wavelength sweeping with less variations in light output.

To achieve the above object, according to a first aspect of the invention, there is provided an external cavity type light source comprising a semiconductor laser coated on one end with a reflection prevention film, wherein emitted light from the end face of the semiconductor laser on the reflection prevention film side is converted into collimated light and the collimated light having a wavelength selected through a diffraction grating is fed back into the semiconductor laser, and wherein emitted light from an opposite end of the semiconductor laser is converted into collimated light and the collimated light is gathered and output to an optical fiber, characterized in that a light branch element is placed between the diffraction grating and the semiconductor laser, and that diffracted light fed back into the semiconductor laser from the diffraction grating is made to branch through the light branch element and one branch light is taken out as output light.

According to the first aspect of the invention, a light branch element is placed between the diffraction grating and the semiconductor laser, and the diffracted light fed back into the semiconductor laser from the diffraction grating is made to branch through the light branch element and one branch light is taken out as output light, so that it is made possible to decrease the naturally emitted light component from the semiconductor laser, contained in the output light. That is, it is made possible to take out light of a pure wavelength with extremely less naturally emitted light as output light.

In a second aspect of the invention, in the external cavity type light source as set forth in the first aspect of the invention, diffracted light having a wavelength selected through the diffraction grating is once applied vertically to a mirror and is again returned to the diffraction grating, then is fed back into the semiconductor laser.

According to the second aspect of the the invention, the diffracted light having a wavelength selected through the diffraction grating is once applied vertically to the mirror and is again returned to the diffraction grating, then is fed back into the semiconductor laser, thus the wavelength selectivity is furthermore enhanced.

In a third aspect of the invention, the external cavity type light source as set forth in the second aspect of the invention further includes a turning mechanism capable of turning the mirror.

According to the third aspect of the invention, the turning mechanism capable of turning the mirror is provided, so that wavelength sweeping corresponding to the turning angle of the mirror is enabled.

In a fourth aspect of the invention, in the external cavity type light source as set forth in the third asepectof the invention, the intersection point of a line extended vertically to an optical axis with an optical position of the end face of the semiconductor laser on the side coated with no reflection prevention film with respect to the diffraction grating as a starting point and an extensions of a diffraction face of the diffraction grating is matched with the turning center of the mirror and the mirror is placed so that the extension of a reflection face of the mirror passes through the intersection point.

According to the fourth aspect of the invention, the intersection point of the line extended vertically to the optical axis with the optical position of the end face of the semiconductor laser on the side coated with no reflection prevention film with respect to the diffraction grating as the starting point and the extension of the diffraction face of the diffraction grating is matched with the turning center of the mirror, and the mirror is placed so that the extension of the reflection face of the mirror passes through the intersection point, so that occurrence of mode hop can be prevented over a wide range and continuous wavelength sweeping with less variations in light output is enabled.

In a fifth aspect of the invention, in the external cavity type light source as claimed in any of the first to fourth aspects of the invention, the light branch element is formed of an unpolarized beam splitter.

According to the fifth aspect of the invention, the diffracted light fed back into the semiconductor laser from the diffraction grating is made to branch through the unpolarized beam splitter and one branch light is taken out as output light.

DETAILED DESCRIPTION OF THE PREFERRED EMBODIMENTS

Referring now to the accompanying drawings (FIGS. 1 to 3), there is shown an embodiment of the invention.

Figure 1:
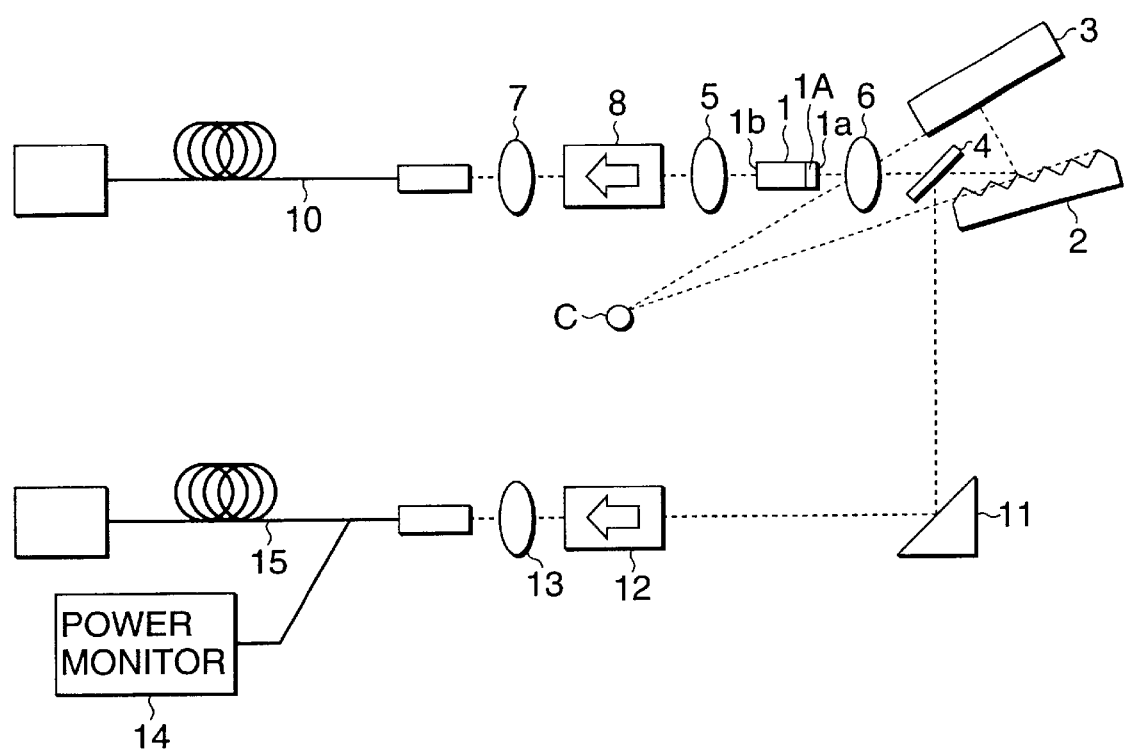
FIG. 1 is a block diagram to show an example of an external cavity type light source incorporating the invention.
Figure 2:
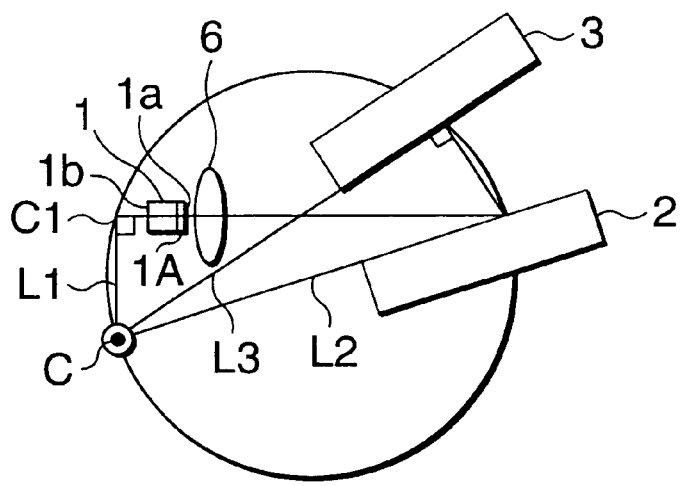
FIG. 2 is a drawing to describe the placement and the operation of a mirror forming a part of the external cavity type light source in FIG. 1.
Figure 3:
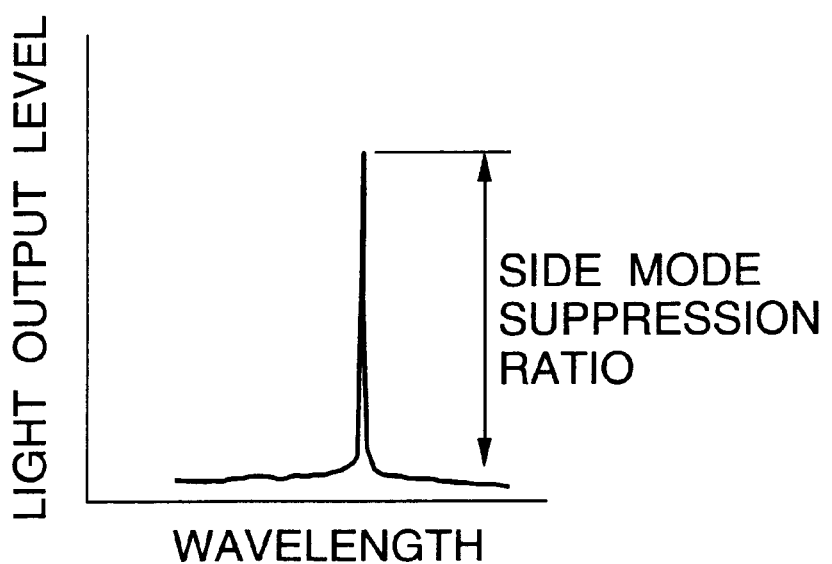
FIG. 3 is a graph to show the spectrum of output light of the external cavity type light source in FIG. 1
Figure 4:
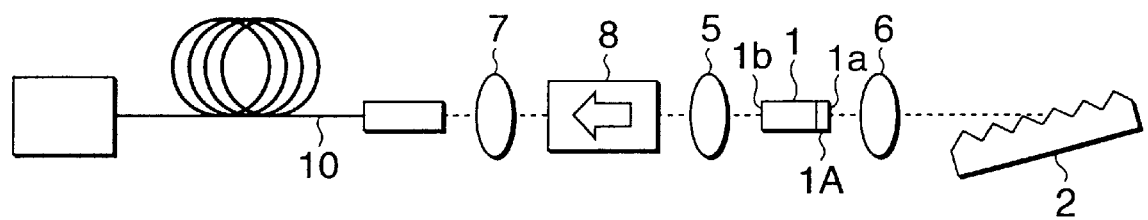
FIG. 4 is a block diagram to show an example of an external cavity type light source in a related art (Littrow optical system)
Figure 5:
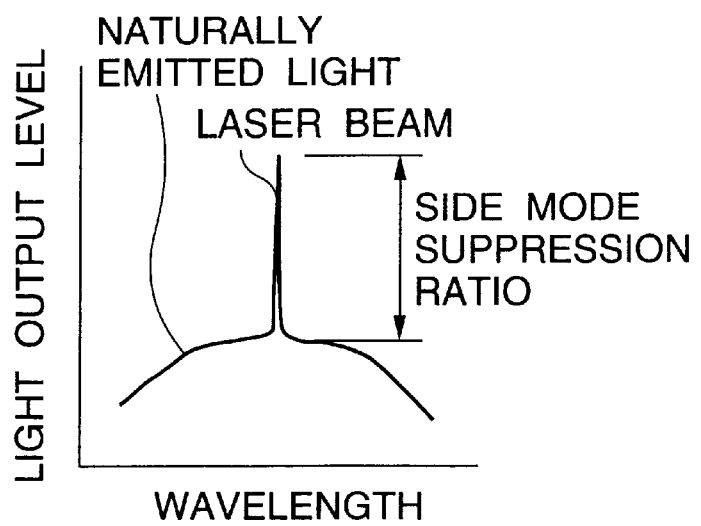
FIG. 5 is a graph to show the spectrum of output light of the external cavity type light source in FIG. 4.

FIG. 1 is a block diagram to show an example of an external cavity type light source incorporating the invention, FIG. 2 is a drawing to describe the placement and the operation of a mirror forming a part of the external cavity type light source in FIG. 1, and FIG. 3 is a graph to show the spectrum of output light of the external cavity type light source in FIG. 1.

The external cavity type light source of the embodiment is made up of an LD 1, a diffraction grating 2, a mirror 3, an unpolarized beam splitter 4 as a light branch element, lenses 5, 6, 7, and 13, light isolators 8 and 12, a triangular prism 11, etc. The LD 1 is coated on one end face 1a (end face on the diffraction grating 2 side) with a reflection prevention film 1A.

In the external cavity type light source in FIG. 1, light emitted from the end face 1a of the LD 1 is converted into collimated light through the lens 6 and passes through the unpolarized beam splitter 4, then is incident on the diffraction grating 2.

Here, the unpolarized beam splitter 4 having a transmission factor of 80% (reflection factor of 20%) is used, thus 80% of the light incident on the unpolarized beam splitter 4 is incident on the diffraction grating 2.

Diffracted light incident on the diffraction grating 2 and having a wavelength selected therethrough is once vertically incident on the mirror 3 and is totally reflected on the mirror 3, then is returned to the diffraction grating 2. That is, the wavelength is selected twice through the diffraction grating 2, whereby the wavelength selectivity is enhanced.

The light whose wavelength is thus selected is again incident on the unpolarized beam splitter 4 and 80% of the incident light passes through and 20% of the incident light is reflected.

The light passing through the unpolarized beam splitter 4 travels in a straight line as it is, and is gathered through the lens 6, then is fed back into the LD 1. That is, an end face 1b of the LD 1 and the diffraction grating 2 make up an external resonator for lasing.

On the other hand, the light reflected on the unpolarized beam splitter 4 is diverted 90 degrees through the triangular prism 11, advances, passes through the light isolator 12, and is gathered through the lens 13, then is taken out to the outside as output light through the optical fiber 15. A part of the output light (for example, 5%) is used for measurement of the current power with a power monitor 14.

The output light thus taken out through the optical fiber 15 contains extremely low components of wavelengths other than the selected wavelength and the side mode suppression ratio exceeds 60 dB as shown in FIG. 3 because the naturally emitted light component occurring in the LD 1 is subject to wavelength selection through the diffraction grating 2.

The emitted light from the end face 1b of the LD 1 is converted into collimated light through the lens 5, passes through the light isolator 8, and is gathered through the lens 7, then is taken out as output light through the optical fiber 10, as in the related art. A part of the output light is used for measurement of the current wavelength with a wavelength monitor (not shown).

The external cavity type light source in FIG. 1 is provided with a turning mechanism (not shown) capable of turning the mirror 3 and the mirror 3 is turned by the turning mechanism, whereby wavelength sweeping is enabled.

Here, the turning center of the mirror 3 matches an intersection point C of a line C1 extended vertically to the optical axis with an optical position C1 of the end face 1b of the LD 1 with respect to the diffraction grating 2 (position of the end face 1b with respect to the diffraction grating 2 if the length in the optical axis direction of the lens 6 and the LD 1) as the starting point and an extension L2 of a diffraction face of the diffraction grating 2.

The mirror 3 is placed so that an extension Le of a reflection face of the mirror 3 passes through the intersection point C.

Such placement of the mirror 3, the diffraction grating 2, and the LD 1 is disclosed in "Novel geometry for single-mode scanning of tunable lasers, Karen Liu & Michael G.Littman/March 1981/Vol. 6 No. 3/Optics Letters p177–p178" and according to the placement, occurrence of mode hop can be prevented in a wide range and continuous wavelength sweeping with less variations in light output is enabled.

Thus, according to the external cavity type light source of the embodiment, the unpolarized beam splitter 4 is placed between the diffraction grating 2 and the LD 1, the diffracted light fed back into the LD 1 from the diffraction grating 2 is made to branch through the unpolarized beam splitter 4, and one branch light is taken out as output light, so that it is made possible to decrease the naturally emitted light component from the LD 1, contained in the output light. That is, it is made possible to take out light of a pure wavelength with extremely less naturally emitted light as output light.

The intersection point C of the line L1 extended vertically to the optical axis with the optical position C1 of the end face 1b of the LD 1 with respect to the diffraction grating 2 as the starting point and the extension L2 of the diffraction face of the diffraction grating 2 is matched with the turning center of the mirror 3, and the mirror 3 is placed so that the extension L3 of the reflection face of the mirror 3 passes through the intersection point C, so that occurrence of mode hop can be prevented in a wide range and continuous wavelength sweeping with less variations in light output is enabled.

In the embodiment, as the light branch element, the unpolarized beam splitter 4 is shown as an example, but the scope of the invention is not limited to it. Any may be adopted as the light branch element if the diffracted light fed back into the LD 1 from the diffraction grating 2 can be made to branch and one branch light can be taken out as output light.

The turning mechanism for turning the mirror 3 can be made up of, for example, a sine bar held rotatably with the intersection point C as the axis center and drive means for rotating the sine bar, such as a direct-acting motor. In this case, the mirror 3 is disposed on the sine bar so that the extension L3 of the reflection face of the mirror 3 passes through the intersection point C.

The transmission factor of the unpolarized beam splitter 4 and the like are also arbitrary and any other specific detail structure, etc., can also be changed whenever necessary, needless to say.

According to the first aspect of the invention, a light branch element is placed between the diffraction grating and the semiconductor laser, and diffracted light fed back into the semiconductor laser from the diffraction grating is made to branch through the light branch element and one branch light is taken out as output light, so that it is made possible to decrease the naturally emitted light component from the semiconductor laser, contained in the output light. That is, it is made possible to take out light of a pure wavelength with extremely less naturally emitted light as output light.

According to the second aspect of the invention, the diffracted light having a wavelength selected through the diffraction grating is once applied vertically to the mirror and is again returned to the diffraction grating, then is fed back into the semiconductor laser, thus the wavelength selectivity is furthermore enhanced.

According to the third aspect of the invention, the turning mechanism capable of turning the mirror is provided, so that wavelength sweeping corresponding to the turning angle of the mirror is enabled.

According to the fourth aspect of the invention, the intersection point of the line extended vertically to the optical axis with the optical position of the end face of the semiconductor laser on the side coated with no reflection prevention film with respect to the diffraction grating as the starting point and the extension of the diffraction face of the diffraction grating is matched with the turning center of the mirror, and the mirror is placed so that the extension of the reflection face of the mirror passes through the intersection point, so that occurrence of mode hop can be prevented over a wide range and continuous wavelength sweeping with less variations in light output is enabled.

According to the fifth aspect of the invention, the diffracted light fed back into the semiconductor laser from the diffraction grating is made to branch through the unpolarized beam splitter and one branch light is taken out as output light.

What is claimed is:

1. An external cavity type light source comprising:

a semiconductor laser coated on one end with a reflection prevention film, in which emitted light from the end face of said semiconductor laser on the reflection prevention film side is converted into collimated light and the collimated light having a wavelength selected through a diffraction grating is fed back into said semiconductor laser, and emitted light from an opposite end of said semiconductor laser is converted into collimated light and the collimated light is condensed and output to an optical fiber;

a light branch element placed between the diffraction grating and said semiconductor laser;

a prism placed outside an axis passing through the diffraction grating and the semiconductor laser;

wherein diffracted light fed back into said semiconductor laser from the diffraction grating is made to branch through the light branch element and one branch light is taken out as output light; and wherein diffracted light from the diffraction grating is made to reflect on the light branch element, divert through the prism, and is taken out as output light.

2. The external cavity type light source as claimed in claim 1 wherein diffracted light having a wavelength selected through the diffraction grating is once applied vertically to a mirror and is again returned to the diffraction grating, then is fed back into said semiconductor laser.

3. The external cavity type light source as claimed in claim 2 further including a turning mechanism capable of turning the mirror.

4. The external cavity type light source as claimed in claim 3 wherein an intersection point of a line extended vertically to an optical axis with an optical position of the end face of said semiconductor laser on the side coated with no reflection prevention film with respect to the diffraction grating as a starting point and an extension of a diffraction face of the diffraction grating is matched with the turning center of the mirror; and wherein the mirror is placed so that the extension of a reflection face of the mirror passes through the intersection point.

5. The external cavity type light source as claimed in claim 1 wherein the light branch element is formed of an unpolarized beam splitter.

* * * * *